United States Patent
Chang

(10) Patent No.: US 11,309,007 B2
(45) Date of Patent: Apr. 19, 2022

(54) WRITE VOLTAGE GENERATOR FOR NON-VOLATILE MEMORY

(71) Applicant: eMemory Technology Inc., Hsin-Chu (TW)

(72) Inventor: Chia-Fu Chang, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 17/204,977

(22) Filed: Mar. 18, 2021

(65) Prior Publication Data
US 2021/0390996 A1 Dec. 16, 2021

Related U.S. Application Data

(60) Provisional application No. 63/038,895, filed on Jun. 14, 2020.

(51) Int. Cl.
| | |
|---|---|
| *G11C 7/04* | (2006.01) |
| *G11C 11/16* | (2006.01) |
| *G11C 13/00* | (2006.01) |
| *G11C 16/04* | (2006.01) |
| *G11C 16/08* | (2006.01) |
| *G11C 16/14* | (2006.01) |
| *G11C 16/24* | (2006.01) |
| *G11C 16/26* | (2006.01) |

(Continued)

(52) U.S. Cl.
CPC ...... *G11C 11/1675* (2013.01); *G11C 11/1697* (2013.01); *G11C 13/0038* (2013.01); *G11C 13/0069* (2013.01); *G11C 16/0433* (2013.01); *G11C 16/08* (2013.01); *G11C 16/14* (2013.01); *G11C 16/24* (2013.01); *G11C 16/26* (2013.01); *G11C 16/30* (2013.01); *H01L 27/11519* (2013.01); *H01L 27/11521* (2013.01); *H01L 27/11524* (2013.01); *H01L 29/42328* (2013.01)

(58) Field of Classification Search
CPC ............ G11C 11/1675; G11C 11/1697; G11C 13/0038; G11C 13/0069; G11C 16/0433; G11C 16/08; G11C 16/14; G11C 16/24; G11C 16/26; G11C 16/30; G11C 2216/10; G11C 16/3409; G11C 16/10; H01L 27/11519; H01L 27/11521; H01L 27/11524; H01L 29/42328
See application file for complete search history.

(56) References Cited

U.S. PATENT DOCUMENTS 9,111,625 B2 8/2015 Ong
10,692,575 B1 * 6/2020 Huang ................. G11C 13/003
(Continued)

*Primary Examiner* — Hien N Nguyen
(74) *Attorney, Agent, or Firm* — WPAT, PC

(57) ABSTRACT

A write voltage generator is connected with a magnetoresistive random access memory. The write voltage generator provides a write voltage during a write operation. A storage state of a selected memory cell in a write path of the magnetoresistive random access memory is changed in response to the write voltage. The write voltage generator includes a temperature compensation circuit and a process corner compensation circuit. The temperature compensation circuit generates a transition voltage according to an ambient temperature. The transition voltage decreases with the increasing ambient temperature. The process corner compensation circuit receives the transition voltage and generates the write voltage.

18 Claims, 9 Drawing Sheets

(51) Int. Cl.
*G11C 16/30* (2006.01)
*H01L 27/11519* (2017.01)
*H01L 27/11524* (2017.01)
*H01L 27/11521* (2017.01)
*H01L 29/423* (2006.01)

(56) References Cited

U.S. PATENT DOCUMENTS

| | | | |
|---|---|---|---|
| 10,930,346 B1* | 2/2021 | Ryu | G11C 13/0069 |
| 2005/0078537 A1* | 4/2005 | So | G11C 7/12 |
| | | | 365/211 |
| 2008/0137460 A1* | 6/2008 | Incarnati | G11C 5/143 |
| | | | 365/212 |
| 2015/0194191 A1* | 7/2015 | Luthra | G11C 13/0002 |
| | | | 365/191 |

* cited by examiner

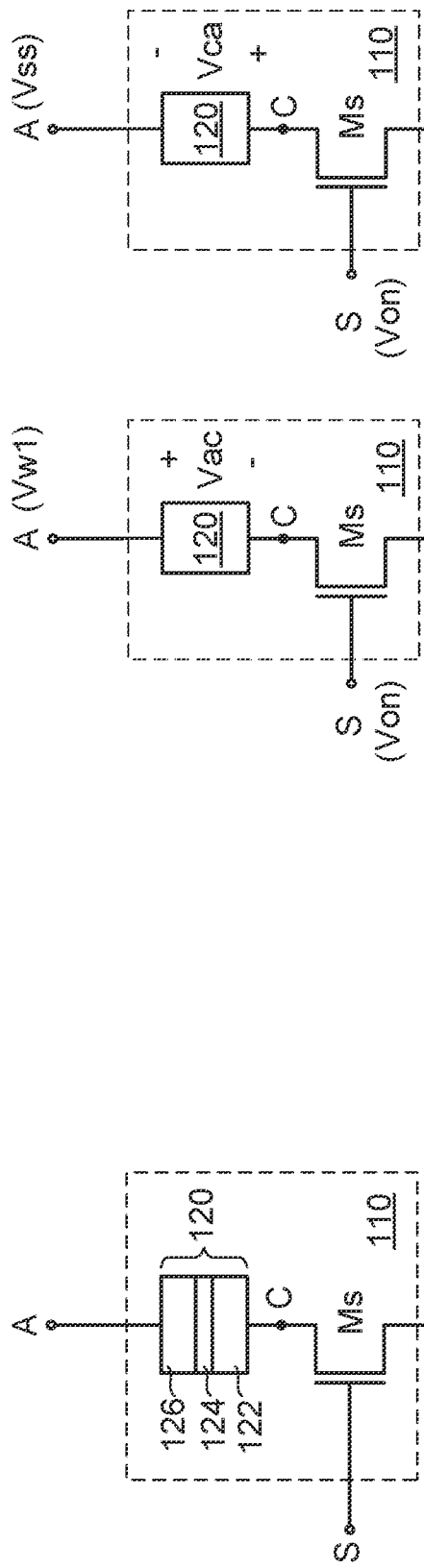
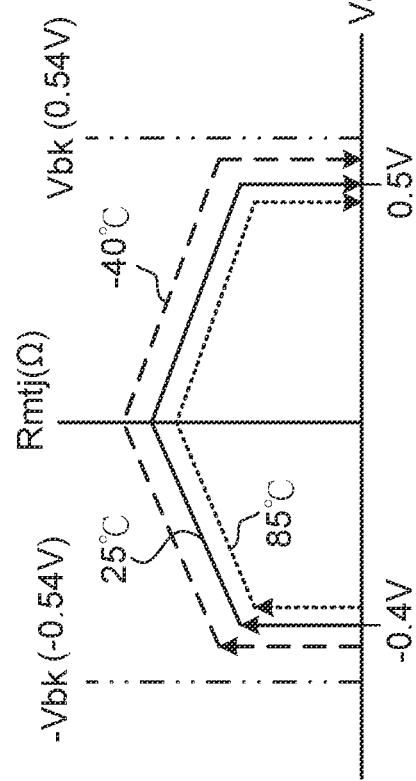
FIG. 1 (prior art)
FIG. 2A (prior art)
FIG. 2B (prior art)
FIG. 2C (prior art)

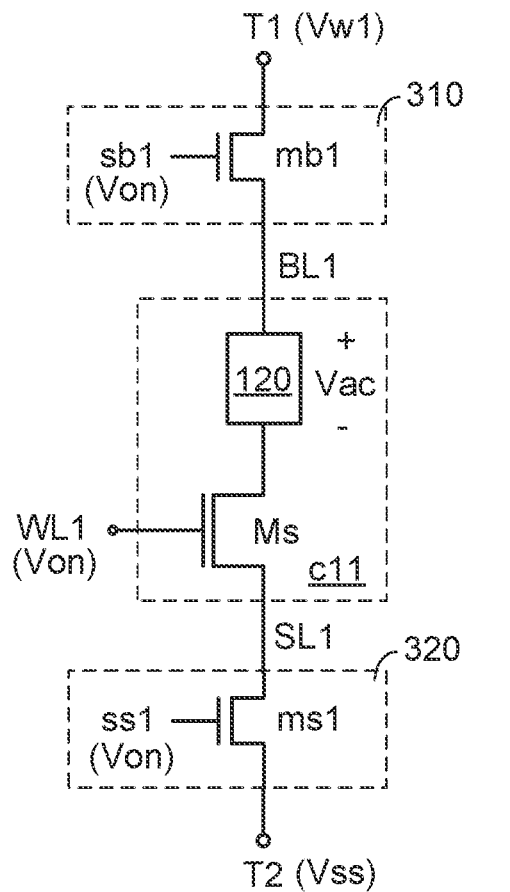 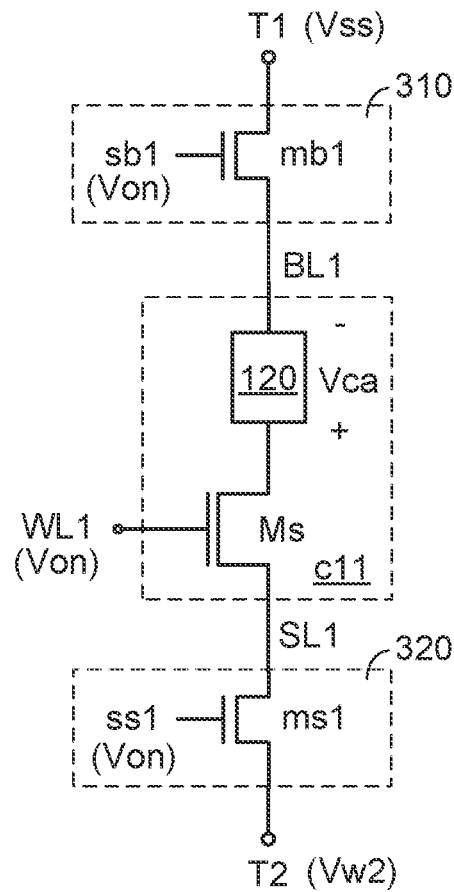
FIG. 3B (prior art)   FIG. 3C (prior art)
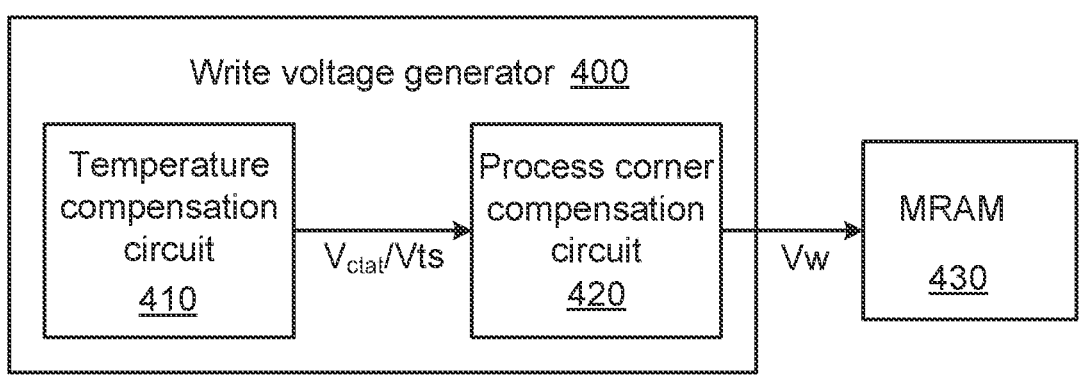
FIG. 4

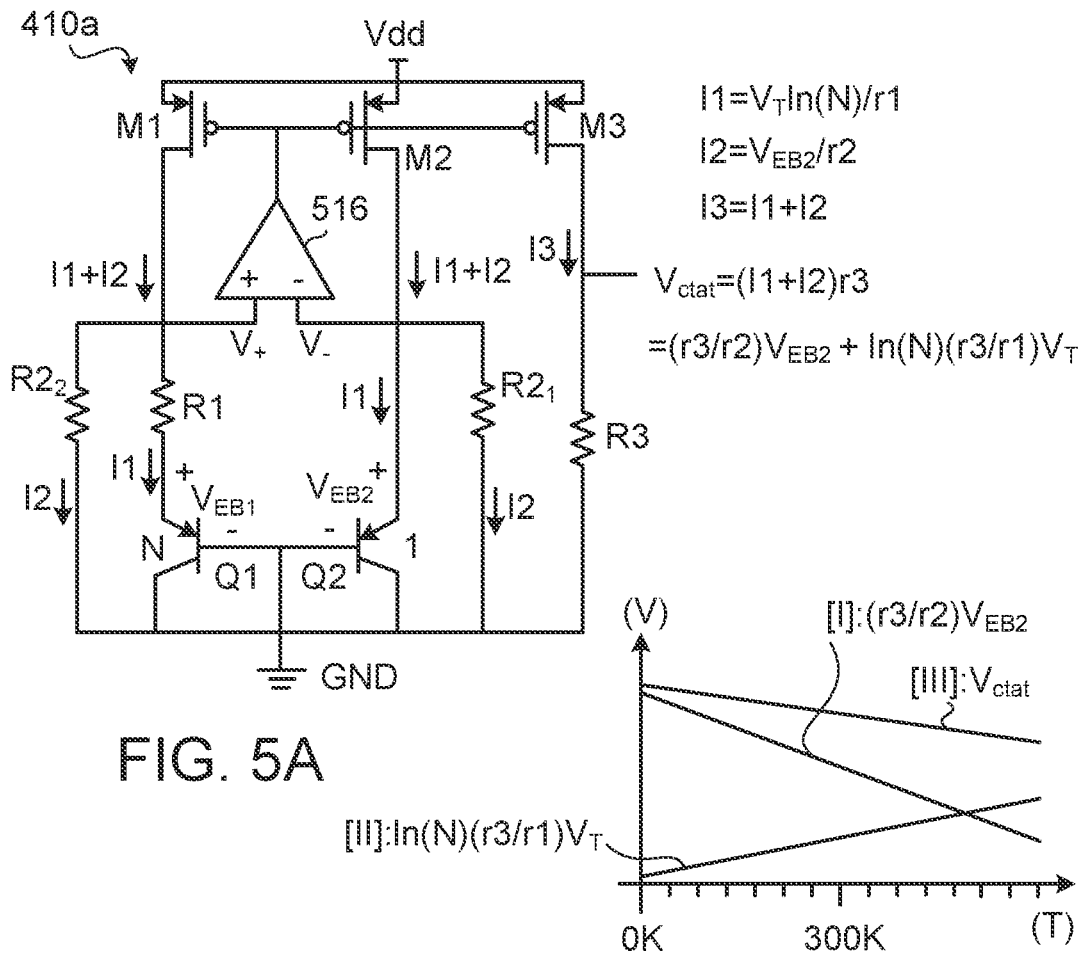
FIG. 5A
FIG. 5B
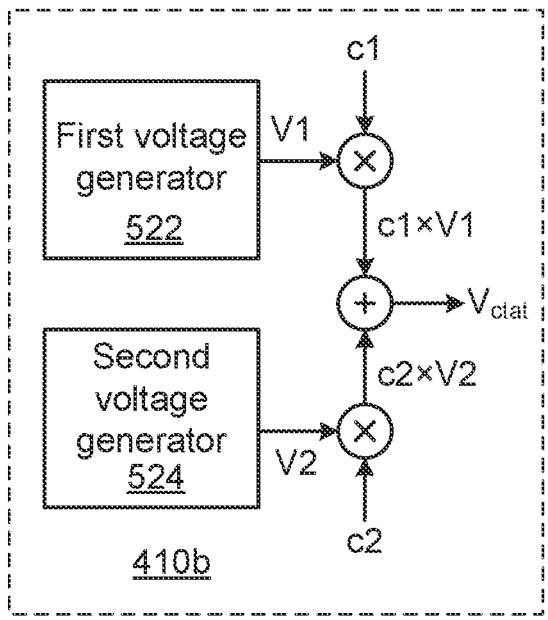
FIG. 5C
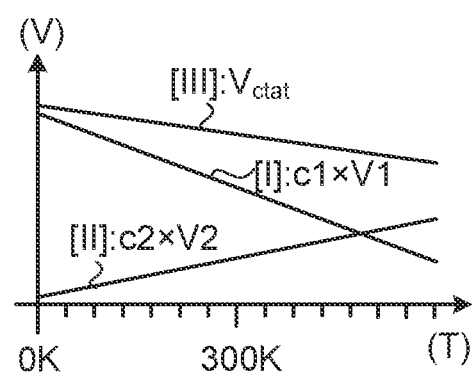
FIG. 5D

WRITE VOLTAGE GENERATOR FOR NON-VOLATILE MEMORY

This application claims the benefit of U.S. provisional application Ser. No. 63/038,895, filed Jun. 14, 2020, the subject matter of which is incorporated herein by reference.

FIELD OF THE INVENTION

The present invention relates to a write voltage generator, and more particularly to a write voltage generator for a non-volatile memory.

BACKGROUND OF THE INVENTION

As is well known, the non-volatile memory can retain stored data even if no electric power is supplied to the non-volatile memory. There are many kinds of non-volatile memory. For example, magnetoresistive random access memory (MRAM) and resistive random-access memory (RRAM or ReRAM) are programmable-erasable non-volatile memory.

FIG. 1 is a schematic circuit diagram illustrating a conventional MRAM cell. As shown in FIG. 1, the conventional MRAM cell 110 comprises a switch transistor Ms and a storage element 120. The storage element 120 is a magnetic tunnel junction (MTJ).

The MRAM cell 110 has three ends A, B and S. The end S is a control terminal. A first drain/source terminal of the switch transistor Ms is connected with a node C. A second drain/source terminal of the switch transistor Ms is connected with the end B. The gate terminal of the switch transistor Ms is connected with the end S. The switch transistor Ms is an NMOS transistor.

The storage element 120 comprises a free layer 126, an isolation layer 124 and a pin layer 122, which are arranged in a stack form. The pin layer 122 of the storage element 120 is connected with the node C. The free layer 126 of the storage element 120 is connected with the end A.

In case that the magnetization directions of the pin layer 122 and the free layer 126 are identical, the storage element 120 has the lower impedance (e.g., 2.0K ohms). Meanwhile, the MRAM cell 110 is in a first storage state, which is also referred as a low impedance state. Whereas, in case that the magnetization directions of the pin layer 122 and the free layer 126 are different, the storage element 120 has the higher impedance (e.g., 4.0K ohms). Meanwhile, the MRAM cell 110 is in a second storage state, which is also referred as a high impedance state. During a write operation, a write voltage is provided to the storage element 120. According to the magnitude of the write voltage, the MRAM cell 110 is selectively in the first storage state or the second storage state.

The MRAM cell 110 as shown in FIG. 1 has other configurations. For example, in another configuration, the pin layer 122 of the storage element 120 is connected with the end A, and the free layer 126 of the storage element 120 is connected with the node C.

FIG. 2A schematically illustrates associated bias voltages for performing a write operation on the conventional MRAM cell to program the conventional MRAM cell into the first storage state. FIG. 2B schematically illustrates associated bias voltages for performing a write operation on the conventional MRAM cell to program the conventional MRAM cell into the second storage state. Generally, while the write operation is performed, a write voltage generator provides different write voltages to the MRAM cell 110. Consequently, the MRAM cell 110 is selectively in the first storage state or the second storage state.

Please refer to FIG. 2A. A first write voltage Vw1 is provided to the end A. A ground voltage Vss is provided to the end B. An on voltage (Von) is provided to the end S to turn on the switch transistor Ms. The first write voltage Vw1 is higher than the ground voltage Vss. The ground voltage Vss is 0V.

After the switch transistor Ms is turned on and the voltage difference Vac between the two terminals of the storage element 120 reaches a first transition voltage, the MRAM cell 110 is changed to the first storage state, i.e., the low impedance state.

Please refer to FIG. 2B. A second write voltage Vw2 is provided to the end B. The ground voltage Vss is provided to the end A. The on voltage (Von) is provided to the end S to turn on the switch transistor Ms. The second write voltage Vw2 is higher than the ground voltage Vss. The ground voltage Vss is 0V.

After the switch transistor Ms is turned on and the voltage difference Vca between the two terminals of the storage element 120 reaches a second transition voltage, the MRAM cell 110 is changed to the second storage state, i.e., the high impedance state.

FIG. 2C is a plot illustrating the transition voltages of the storage elements and the impedance (Rmtj) at different temperatures. For changing the storage state of the MRAM cell 110 to the first storage state at room temperature (e.g., 25° C.), the voltage difference Vac across the two terminals of the storage element 120 needs to be higher than 0.5V. In other words, the first transition voltage for changing the second storage state to the first storage state is 0.5V.

For changing the storage state of the MRAM cell 110 to the second storage state, the voltage difference Vac across the two terminals of the storage element 120 needs to be lower than −0.4V. That is, the voltage difference Vca needs to be higher than 0.4V. In other words, the second transition voltage for changing the first storage state to the second storage state is −0.4V.

Moreover, as the temperature decreases, the absolute value of the transition voltage for the storage element 120 increases. Whereas, as the temperature increases, the absolute value of the transition voltage for the storage element 120 decreases. For example, at −40° C., the first transition voltage is higher than 0.5V, and the second transition voltage is lower than −0.4V. Moreover, at 85° C., the first transition voltage is lower than 0.5V, and the second transition voltage is higher than −0.4V.

Please refer to FIG. 2C again. If the absolute value of the voltage difference across the two terminals of the storage element 120 is higher than a breakdown voltage Vbk, the storage element 120 will be permanently damaged, and the storage state of the storage element 120 cannot be changed. For example, the breakdown voltage Vbk is 0.54V.

Since the MRAM cell 110 comprises the switch transistor Ms and the switch transistor Ms may be regarded as a load, there is a voltage drop across the two terminals of the switch transistor Ms during the write operation. That is to say, during the write operation, the first write voltage Vw1 provided by the write voltage generator (not shown) needs to be higher than the first transition voltage. Similarly, the second write voltage Vw2 provided by the write voltage generator (not shown) is also higher than the second transition voltage. For example, at 25° C., the first write voltage Vw1 needs to be higher than 0.5V, and the second write voltage Vw2 needs to be higher than 0.4V.

In case that plural memory cells are combined as a memory cell array, the write path contains more loads. FIG. 3A is a schematic circuit diagram illustrating a MRAM with plural MRAM cells. As shown in FIG. 3A, the MRAM comprises a memory cell array 300, a bit line multiplexer 310 and a source line multiplexer 320. The MRAM is a non-volatile memory.

The memory cell array 300 comprises plural memory cells c11~cmn, which are arranged in an m×n array. Each of the memory cells c11~cmn has the structure of the MRAM cell as shown in FIG. 1.

The control terminals of the n memory cells c11~c1n in the first row are connected with the word line WL1. The first terminals of the n memory cells c11~c1n in the first row are connected with the corresponding bit lines BL1~BLn. The second terminals of the n memory cells c11~c1n in the first row are connected with the corresponding source lines SL1~SLn. The control terminals of the n memory cells c21~c2n in the second row are connected with the word line WL2. The first terminals of the n memory cells c21~c21n in the second row are connected with the corresponding bit lines BL1~BLn. The second terminals of the n memory cells c11~c1n in the second row are connected with the corresponding source lines SL1~SLn. The rest may be deduced by analog. The control terminals of the n memory cells cm1~cmn in the m-th row are connected with the word line WLm. The first terminals of the n memory cells cm1~cmn in the m-th row are connected with the corresponding bit lines BL1~BLn. The second terminals of the n memory cells c11~c1n in the m-th row are connected with the corresponding source lines SL1~SLn.

The bit line multiplexer 310 comprises n select transistors mb1~mbn. The first drain/source terminals of the n select transistors mb1~mbn are connected with a first voltage receiving terminal T1. The second drain/source terminals of the n select transistors mb1~mbn are connected with the corresponding bit lines BL1~BLn. The gate terminals of n select transistors mb1~mbn receive corresponding bit line selecting signals sb1~sbn.

The source line multiplexer 320 comprises n select transistors ms1~msn. The first drain/source terminals of the n select transistors ms1~msn are connected with the corresponding source lines SL1~SLn. The second drain/source terminals of the n select transistors ms1~msn are connected with a second voltage receiving terminal T2. The gate terminals of n select transistors ms1~msn receive corresponding source line selecting signals ss1~ssn.

It is noted that the circuitry structures of the bit line multiplexer 310 and the source line multiplexer 320 are not restricted to the circuitry structure as shown in FIG. 3A. Alternatively, each of the bit line multiplexer and the source line multiplexer for the MRAM may comprise more transistors.

During the write operation, only one of the n word lines WL1~WLn is activated, and the other word lines are inactivated. In addition, only one of the n bit line selecting signals sb1~sbn is activated, and the other bit line selecting signals are inactivated. In addition, only one of the n source line selecting signals ss1~ssn is activated, and the other source line selecting signals are inactivated.

Consequently, a selected memory cell in the memory cell array 300 is determined according to the activated word line, the activated bit line selecting signal and the activated source line selecting signal. For example, when the word line WL1, the bit line selecting signal sb1 and the source line selecting signal ss1 are activated, the memory cell c11 is the selected memory cell. Moreover, by providing proper voltages to the two voltage receiving terminals T1 and T2, the selected memory cell is in the first storage state or the second storage state.

For illustration, the memory cell c11 is taken as an example. FIG. 3B schematically illustrates associated bias voltages for performing a write operation on the selected memory cell to program the selected memory cell into the first storage state. FIG. 3C schematically illustrates associated bias voltages for performing a write operation on the selected memory cell to program the selected memory cell into the second storage state.

Please refer to FIG. 3B. A first write voltage Vw1 is provided to the first voltage receiving terminal T1. A ground voltage Vss is provided to the second voltage receiving terminal T2. An on voltage (Von) is provided to the word line WL1 to activate the word line WL1. The first write voltage Vw1 is higher than the ground voltage Vss. The ground voltage Vss is 0V.

When the bit line selecting signal sb1 and the source line selecting signal ss1 receive the on voltage (Von) and are activated, a write path is formed between the first voltage receiving terminal T1 and the second voltage receiving terminal T2. The write path includes the bit line multiplexer 310, the bit line BL1, the selected memory cell c11, the source line SL1 and the source line multiplexer 320. When the voltage difference Vac between the two terminals of the storage element 120 of the selected memory cell c11 reaches a first transition voltage, the selected memory cell c11 is changed to the first storage state, i.e., the low impedance state.

Please refer to FIG. 3C. The ground voltage Vss is provided to the first voltage receiving terminal T1. A second write voltage Vw2 is provided to the second voltage receiving terminal T2. The on voltage (Von) is provided to the word line WL1 to activate the word line WL1. The second write voltage Vw2 is higher than the ground voltage Vss. The ground voltage Vss is 0V.

When the bit line selecting signal sb1 and the source line selecting signal ss1 receive the on voltage (Von) and are activated, a write path is formed between the first voltage receiving terminal T1 and the second voltage receiving terminal T2. The write path includes the bit line multiplexer 310, the bit line BL1, the selected memory cell c11, the source line SL1 and the source line multiplexer 320. When the voltage difference Vca between the two terminals of the storage element 120 of the selected memory cell c11 reaches a second transition voltage, the selected memory cell c11 is changed to the second storage state, i.e., the high impedance state.

As mentioned above, the write path comprises plural loads (e.g., the switch transistors mb1, Ms1 and ms1) in addition to the storage element 120. Consequently, the first write voltage Vw1 provided by the write voltage generator (not shown) is higher than the first transition voltage, and the second write voltage Vw2 provided by the write voltage generator (not shown) is also higher than the second transition voltage.

However, since the first transition voltage and the breakdown voltage Vbk are very close. If the set value of the first write voltage Vw1 is too high, the voltage difference across the two terminals of the storage element 120 is possibly higher than the breakdown voltage Vbk and thus the storage element 120 is damaged. Whereas, if the set value of the first write voltage Vw1 is too low, the storage state of the storage element 120 cannot be successfully changed to first storage state.

Similarly, if the set value of the second write voltage Vw2 is too high, the voltage difference across the two terminals of the storage element 120 is possibly higher than the breakdown voltage Vbk and thus the storage element 120 is damaged. Whereas, if the set value of the second write voltage Vw2 is too low, the storage state of the storage element 120 cannot be successfully changed to second storage state.

As mentioned above, the transition voltages of the storage element 120 may be changed with the ambient temperature change. Moreover, the resistance values of the switch transistors mb1, Ms1 and ms1 in the write path may be changed according to the process corner. For example, if the switch transistor is a slow corner (S corner) transistor, the internal resistance is higher. Whereas, if the switch transistor is a fast corner (F corner) transistor, the internal resistance is lower.

As mentioned above, it is difficult to design a write voltage generator that is capable of generating a proper write voltage according to the ambient temperature change and the process corner change.

SUMMARY OF THE INVENTION

An embodiment of the present invention provides a write voltage generator. The write voltage generator is coupled to a memory cell array. The write voltage generator provides a write voltage during a write operation. A storage state of a selected memory cell in a write path of the memory cell array is changed in response to the write voltage. The write voltage generator includes a temperature compensation circuit and a process corner compensation circuit. The temperature compensation circuit generates a transition voltage according to an ambient temperature. The transition voltage decreases with the increasing ambient temperature. The process corner compensation circuit includes a current mirror, a storage element equivalent circuit and a write path equivalent circuit. The current mirror receives the transition voltage. The storage element equivalent circuit is connected between a first terminal of the current mirror and a ground terminal. A second terminal of the current mirror is connected with a first node. The write path equivalent circuit is connected between the first node and the ground terminal. The write voltage is outputted from the first node.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1 is a schematic circuit diagram illustrating a conventional MRAM cell;

FIG. 2A schematically illustrates associated bias voltages for performing a write operation on the conventional MRAM cell to program the conventional MRAM cell into the first storage state;

FIG. 2B schematically illustrates associated bias voltages for performing a write operation on the conventional MRAM cell to program the conventional MRAM cell into the second storage state;

FIG. 2C is a plot illustrating the transition voltages of the storage elements at different temperatures;

FIG. 3B schematically illustrates associated bias voltages for performing a write operation on the selected memory cell to program the selected memory cell into the first storage state;

FIG. 3C schematically illustrates associated bias voltages for performing a write operation on the selected memory cell to program the selected memory cell into the second storage state;

FIG. 4 is a schematic circuit diagram illustrating a write voltage generator for a MRAM according to an embodiment of the present invention;

FIG. 5A is a schematic circuit diagram illustrating first exemplary temperature compensation circuit of the write voltage generator according to the embodiment of the present invention;

FIG. 5B is a plot illustrating the relationship between the transition voltage and the temperature of the temperature compensation circuit as shown in FIG. 5A;

FIG. 5C is a schematic circuit diagram illustrating a second exemplary temperature compensation circuit of the write voltage generator according to the embodiment of the present invention;

FIG. 5D is a plot illustrating the relationship between the transition voltage and the temperature of the temperature compensation circuit as shown in FIG. 5C;

DETAILED DESCRIPTION OF PREFERRED EMBODIMENTS

Figure 3A:
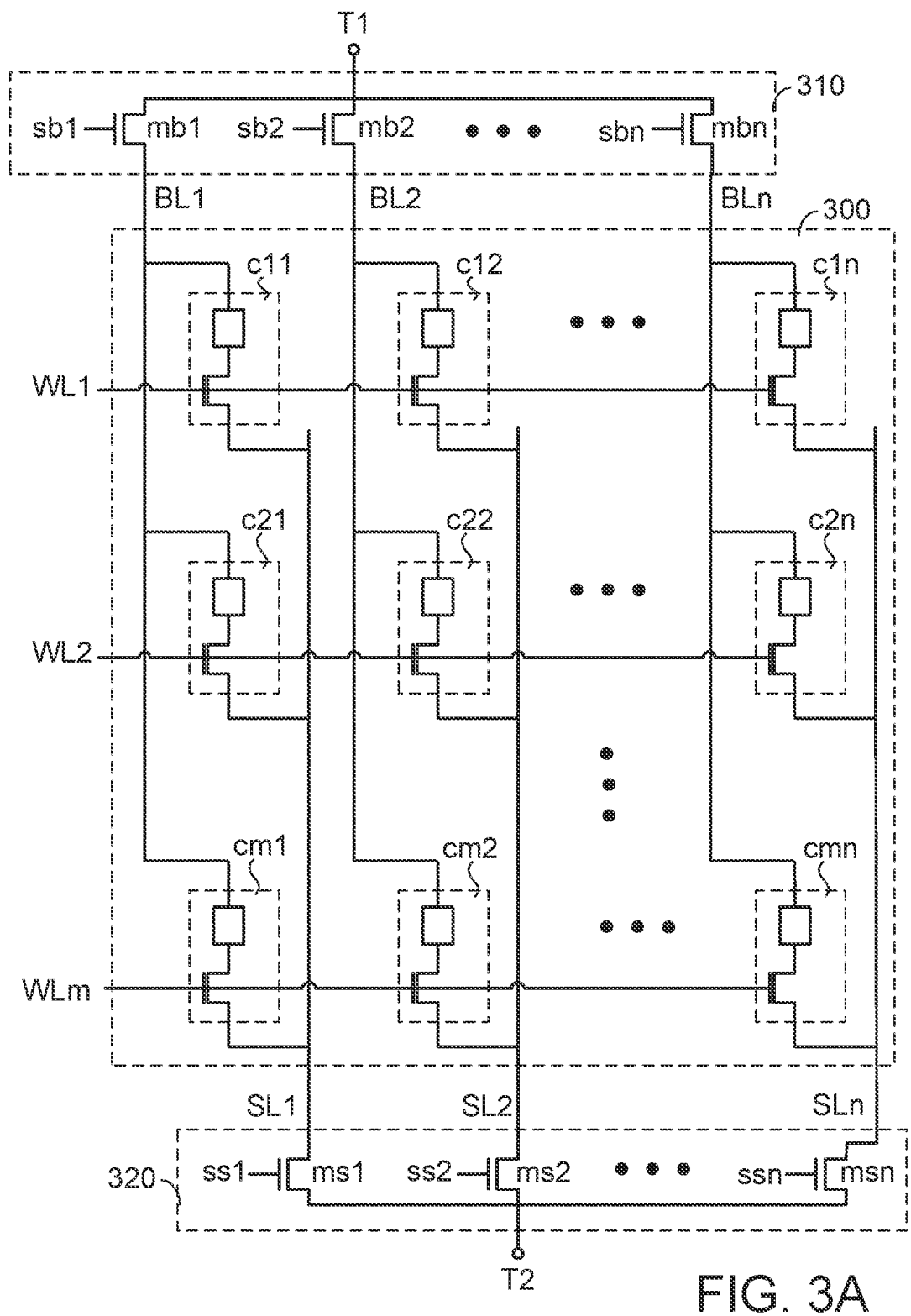
FIG. 3A is a schematic circuit diagram illustrating a MRAM with plural MRAM cells.

FIG. 4 is a schematic circuit diagram illustrating a write voltage generator for a MRAM according to an embodiment of the present invention. As shown in FIG. 4, the write voltage generator 400 comprises a temperature compensation circuit 410 and a process corner compensation circuit 420. The write voltage generator 400 is connected with a MRAM 430. During a write operation, the write voltage generator 400 provides a write voltage Vw to the MRAM 430. The circuitry structure of the MRAM 430 is similar to that of FIG. 3A. The write voltage Vw may be a first write voltage (e.g., Vw1 as shown in FIG. 3B) or a second write voltage (e.g., Vw2 as shown in FIG. 3C). In case that the write voltage Vw is the first write voltage, the storage state of the selected memory cell in the MRAM 430 is changed from a second storage state to a first storage state. In case that the write voltage Vw is the second write voltage, the storage state of the selected memory cell in the MRAM 430 is changed from the first storage state to the second storage state.

In accordance with a feature of the present invention, the temperature compensation circuit 410 generates a transition voltage Vts according to the ambient temperature. As the ambient temperature increases, the transition voltage Vts generated by the temperature compensation circuit 410 decreases. Moreover, according to the transition voltage Vts, the process corner compensation circuit 420 generates the write voltage Vw. The detailed circuitry structures of the temperature compensation circuit 410 and the process corner compensation circuit 420 will be described as follows.

According to the characteristics of the storage element of the MRAM cell, the transition voltage of the storage element decreases with the increasing ambient temperature, and the transition voltage of the storage element increases with the decreasing ambient temperature. Consequently, the transition voltage generated by the temperature compensation circuit 410 needs to comply with the above characteristics.

For example, the temperature compensation circuit 410 may be a complementary to absolute temperature circuit (also referred as a CTAT circuit), and the CTAT circuit is capable of generating a voltage $V_{ctat}$ as the transition voltage Vts. In some embodiments, the temperature compensation circuit 410 may include a CTAT circuit and some auxiliary circuits, and the temperature compensation circuit 410 is capable of generating the transition voltage Vts.

FIG. 5A is a schematic circuit diagram illustrating a first exemplary temperature compensation circuit of the write voltage generator according to the embodiment of the present invention. FIG. 5B is a plot illustrating the relationship between the transition voltage and the temperature of the temperature compensation circuit as shown in FIG. 5A. In this embodiment, the temperature compensation circuit 410a is a complementary to absolute temperature circuit.

The temperature compensation circuit 410a comprises three PMOS transistors M1, M2, M3, two PNP bipolar junction transistors (BJT) Q1, Q2, four resistors R1, R2$_1$, R2$_2$, R3, and an operational amplifier 516. The resistance value of the resistor R1 is r1. The resistance value of the resistor R2$_1$ is r2. The resistance value of the resistor R2$_2$ is r2. The resistance value of the resistor R3 is r3. The PMOS transistors M1, M2 and M3 are collaboratively formed as a current mirror. In an embodiment, the aspect ratios (W/L) of the PMOS transistors M1, M2 and M3 are equal. The gate terminals of the PMOS transistors M1, M2 and M3 are connected with each other. The first drain/source terminals of the PMOS transistors M1, M2 and M3 receive a supply voltage Vdd. The second drain/source terminals of the PMOS transistors M1, M2 and M3 output currents with the same magnitude.

The output terminal of the operational amplifier 516 is connected with the gate terminals of the PMOS transistors M1, M2 and M3. The second drain/source terminal of the PMOS transistor M1 is connected with the positive input terminal of the operational amplifier 516. The second drain/source terminal of the PMOS transistor M2 is connected with the negative input terminal of the operational amplifier 516. The resistor R3 is connected between the second drain/source terminal of the PMOS transistor M3 and the ground terminal GND. The second drain/source terminal of the PMOS transistor M3 is used as an output terminal of the CTAT to generate a voltage $V_{ctat}$. In addition, the voltage $V_{ctat}$ is equal to the transition Vts (i.e., $V_{ctat}$=Vts).

The area of the PNP bipolar junction transistor Q1 is N times the area of the PNP bipolar junction transistor Q2. The base terminals and the collector terminals of the PNP bipolar junction transistors Q1 and Q2 are connected to the ground terminal GND. In other words, the PNP bipolar junction transistors Q1 and Q2 are in diode connection. The negative input terminal of the operational amplifier 516 is connected with the emitter of the PNP bipolar junction transistor Q2. The resistor R2$_1$ is connected between the negative input terminal of the operational amplifier 516 and the ground terminal GND. The first resistor R1 is connected between the positive input terminal of the operational amplifier 516 and the emitter of the PNP bipolar junction transistor Q1. The resistor R2$_2$ is connected between the positive input terminal of the operational amplifier 516 and the ground terminal GND.

In case that the operational amplifier 516 has an infinite gain, the negative input terminal voltage V$_-$ and the positive input terminal voltage V$_+$ of the operational amplifier 516 will be equal. That is, r1×I1+V$_{EB1}$=V$_{EB2}$.

As mentioned above, the PNP bipolar junction transistors Q1 and Q2 are in diode connection, and the area of the PNP bipolar junction transistor Q1 is N times the area of the PNP bipolar junction transistor Q2. Consequently, the associated currents and the associated voltages may be expressed by the following mathematic formulae:

$$I1 = N \cdot I_s e^{\frac{V_{EB1}}{V_T}} \text{ and } I1 = I_s e^{\frac{V_{EB2}}{V_T}},$$

that is, $V_{EB1}$=V$_T$ ln(I1/N–I$_s$) and $V_{EB2}$=V$_T$ ln(I1/I$_s$).

In the above mathematic formulae, I$_s$ is the saturation current of the PNP bipolar junction transistor Q2, and V$_T$ is a thermal voltage.

Furthermore, the associated currents and the associated voltages may be expressed by the following mathematic formulae: I1=V$_T$ ln(N)/r1, I2=V$_{EB2}$/r2, and Vts=V$_{ctat}$=(r3/r2)V$_{EB2}$+ln(N)(r3/r1)V$_T$.

In the above mathematic formula, it may be regarded that V$_{EB2}$ is a base-emitter voltage generated by a base-emitter voltage generator and the thermal voltage V$_T$ is generated by a thermal voltage generator. In other words, the voltage V$_{ctat}$ (i.e., transition voltage Vts) is equal to a product of the base-emitter voltage V$_{EB2}$ and a first constant (r3/r2) plus a product of the thermal voltage V$_T$ and a second constant [ln(N)(r3/r1)].

Please refer to FIG. 5B. Since V$_{EB2}$=I2*r2 and I2 has the negative temperature coefficient, the base-emitter voltage V$_{EB2}$ has the negative temperature coefficient correspondingly, and the characteristic curve I corresponding to the product of the first constant (r3/r2) and the base-emitter voltage V$_{EB2}$ decreases with the increasing absolute temperature. The slope of the characteristic curve I may be determined according to the first constant (r3/r2). Similarly, since the thermal voltage V$_T$ has the positive temperature coefficient, the characteristic curve II corresponding to the product of the second constant [ln(N)(r3/r1)] and the thermal voltage V$_T$ increases with the increasing absolute temperature. The slope of the characteristic curve II may be determined according to the second constant [ln(N)(r3/r1)]. By properly adjusting the first constant and the second constant, the characteristic curve III of the voltage $V_{ctat}$ is generated. In addition, the voltage $V_{ctat}$ decreases with the increasing ambient temperature.

It is noted that the example of the temperature compensation circuit 410 is not restricted to the CTAT circuit as shown in FIG. 5A. That is, the circuitry structure of the temperature compensation circuit may be varied according to the practical requirements.

FIG. 5C is a schematic circuit diagram illustrating a second exemplary temperature compensation circuit of the write voltage generator according to the embodiment of the present invention. FIG. 5D is a plot illustrating the relationship between the transition voltage and the temperature of the temperature compensation circuit as shown in FIG. 5C. In this embodiment, the temperature compensation circuit 410b is another CTAT circuit.

The temperature compensation circuit 410b comprises a first voltage generator 522 and a second voltage generator 524. The first voltage generator 522 generates a first voltage V1 with a negative temperature coefficient. The second voltage generator 524 generates a second voltage V2 with a positive temperature coefficient. In other words, the voltage $V_{ctat}$ is equal to a product of the first voltage V1 and a first constant c1 plus a product of the second voltage V2 and a second constant c2, i.e., $V_{ctat}=c1 \times V1+c2 \times V2$.

In the CTAT circuit, the first voltage generator 522 may be regarded as a base-emitter voltage generator, the first voltage V1 may be regarded as the base-emitter voltage of the bipolar junction transistor (e.g., $V_{EB2}$), the second voltage generator 524 may be regarded as a thermal voltage generator, and the second voltage V2 may be regarded as a thermal voltage $V_T$.

Please refer to FIG. 5D. The curve I is a characteristic curve corresponding to c1×V1, the curve II is a characteristic curve corresponding to c2×V2, and the curve III is a characteristic curve of the voltage $V_{ctat}$. Since the first voltage V1 has the negative temperature coefficient, the characteristic curve I corresponding to c1×V1 decreases with the increasing absolute temperature. The slope of the characteristic curve I may be determined according to the first constant c1. Similarly, since the second voltage V2 has the positive temperature coefficient, the characteristic curve II corresponding to c2×V2 increases with the increasing absolute temperature. The slope of the characteristic curve II may be determined according to the second constant c2. By properly adjusting the first constant c1 and the second constant c2, the characteristic curve III of the voltage $V_{ctat}$ is generated. In addition, the voltage $V_{ctat}$ decreases with the increasing ambient temperature.

Figures 5E, 5F, 6A:
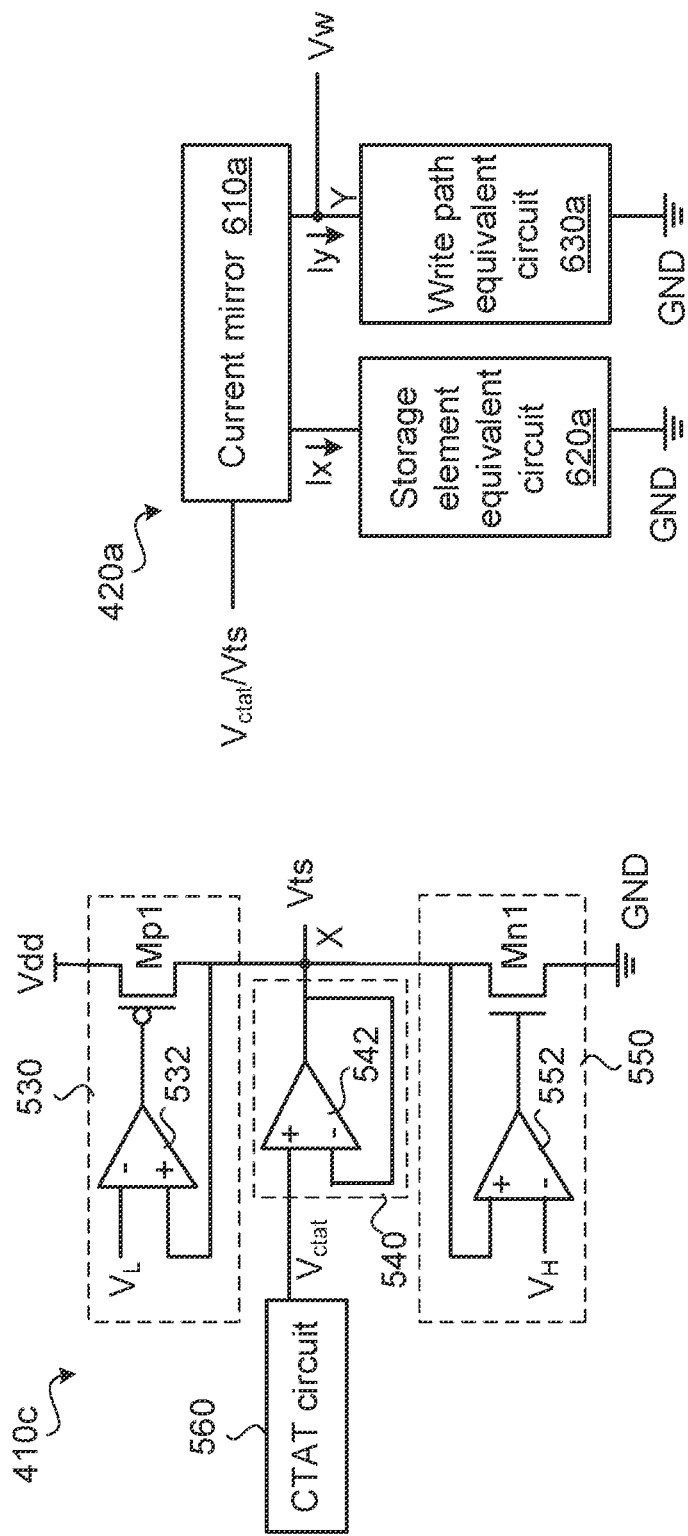
FIG. 5E is a schematic circuit diagram illustrating a third exemplary temperature compensation circuit of the write voltage generator according to the embodiment of the present invention.
FIG. 5F is a plot illustrating the relationship between the transition voltage and the temperature of the temperature compensation circuit as shown in FIG. 5E.
FIG. 6A is a schematic circuit diagram illustrating a first exemplary process corner compensation circuit of the write voltage generator according to the embodiment of the present invention.

FIG. 5E is a schematic circuit diagram illustrating a third exemplary temperature compensation circuit of the write voltage generator according to the embodiment of the present invention. FIG. 5F is a plot illustrating the relationship between the transition voltage and the temperature of the temperature compensation circuit as shown in FIG. 5E. In this embodiment, the temperature compensation circuit 410c comprises a CTAT circuit 560, a buffering circuit 540, a lower voltage limiting circuit 530 and an upper voltage limiting circuit 550. The CTAT circuit 560 has the circuitry structure of the CTAT circuit as shown in FIG. 5A or FIG. 5C.

The voltage output terminal of the CTAT circuit 550 is connected with the buffering circuit 540. The buffering circuit 540 comprises an operational amplifier 542. The positive input terminal of the operational amplifier 542 is connected with the voltage output terminal of the CTAT circuit 560 to receive the voltage $V_{ctat}$. The negative input terminal of the operational amplifier 542 is connected with the output terminal of the operational amplifier 542. The output terminal of the operational amplifier 542 is connected with a node X.

The lower voltage limiting circuit 530 comprises an operational amplifier 532 and a PMOS transistor Mp1. The input terminal of the lower voltage limiting circuit 530 receives a lower limit voltage $V_L$. The output terminal of the lower voltage limiting circuit 530 is connected with the node X. The negative input terminal of the operational amplifier 532 receives the lower limit voltage $V_L$. The positive input terminal of the operational amplifier 532 is connected with the node X. The first drain/source terminal of the PMOS transistor Mp1 receives the supply voltage Vdd. The gate terminal of the PMOS transistor Mp1 is connected with the output terminal of the operational amplifier 532. The second drain/source terminal of the PMOS transistor Mp1 is connected with the node X.

The upper voltage limiting circuit 550 comprises an operational amplifier 552 and an NMOS transistor Mn1. The input terminal of the upper voltage limiting circuit 550 receives an upper limit voltage $V_H$. The output terminal of the upper voltage limiting circuit 550 is connected with the node X. The negative input terminal of the operational amplifier 552 receives the upper limit voltage $V_H$. The positive input terminal of the operational amplifier 552 is connected with the node X. The first drain/source terminal of the NMOS transistor Mn1 is connected with the ground terminal GND. The gate terminal of the NMOS transistor Mn1 is connected with the output terminal of the operational amplifier 552. The second drain/source terminal of the NMOS transistor Mn1 is connected with the node X. The upper limit voltage $V_H$ is higher than the lower limit voltage $V_L$.

As shown in FIG. 5F, the transition voltage Vts provided by the temperature compensation circuit 410c is limited between the upper limit voltage $V_H$ and the lower limit voltage $V_L$, and the transition voltage Vts decreases with the increasing ambient temperature. In an embodiment, the set value of the upper limit voltage VH of the upper voltage limiting circuit 550 is lower than the breakdown voltage of the storage element (e.g., 0.53V). Consequently, the voltage received by the storage element of the MRAM will not exceed the breakdown voltage Vbk, and the storage element of the MRAM will not be damaged.

In some embodiments, the temperature compensation circuit 410c may include one of the two voltage limiting circuits 530 and 550. For example, only the upper voltage limiting circuit 550 is used to limit the the transition voltage Vts not exceeding the breakdown voltage Vbk.

FIG. 6A is a schematic circuit diagram illustrating a first exemplary process corner compensation circuit of the write voltage generator according to the embodiment of the present invention. The process corner compensation circuit 420a comprises a current mirror 610a, a storage element equivalent circuit 620a and a write path equivalent circuit 630a.

The current mirror 610a receives the transition voltage Vts or the voltage $V_{ctat}$ from the temperature compensation circuit. The current mirror 610a comprises a first terminal and a second terminal. The storage element equivalent circuit 620a is connected between the first terminal and the ground terminal GND. The second terminal is connected with a node Y. The write path equivalent circuit 630a is connected between the node Y and the ground terminal GND. The write voltage $V_w$ is generated and outputted from the node Y.

The transition voltage Vts or the voltage $V_{ctat}$ is received by the current mirror 610a and then the transition voltage Vts or the voltage $V_{ctat}$ is provided to the first terminal. Consequently, the storage element equivalent circuit 620a generates an input current Ix in response to the transition voltage Vts or the voltage $V_{ctat}$.

According to the input current Ix, a mirror current Iy is generated from the second terminal of the current mirror 610a, and the mirror current Iy flows to the write path equivalent circuit 630a. The mirror current Iy flows through the write path equivalent circuit 630a to generate the write voltage Vw. Moreover, the write voltage Vw is outputted from the node Y. The input current Ix is equal to the mirror current Iy.

According to the embodiment of the present invention, the process corner compensation circuit may provide different write voltages to the MRAM 430 during the write operation. For example, the process corner compensation circuit provides a first write voltage Vw1 for changing the selected memory cell from the second storage state to the first storage state. Or, the process corner compensation circuit provides a second write voltage Vw2 for changing the selected memory cell from the first storage state to the second storage state.

Figure 6B:
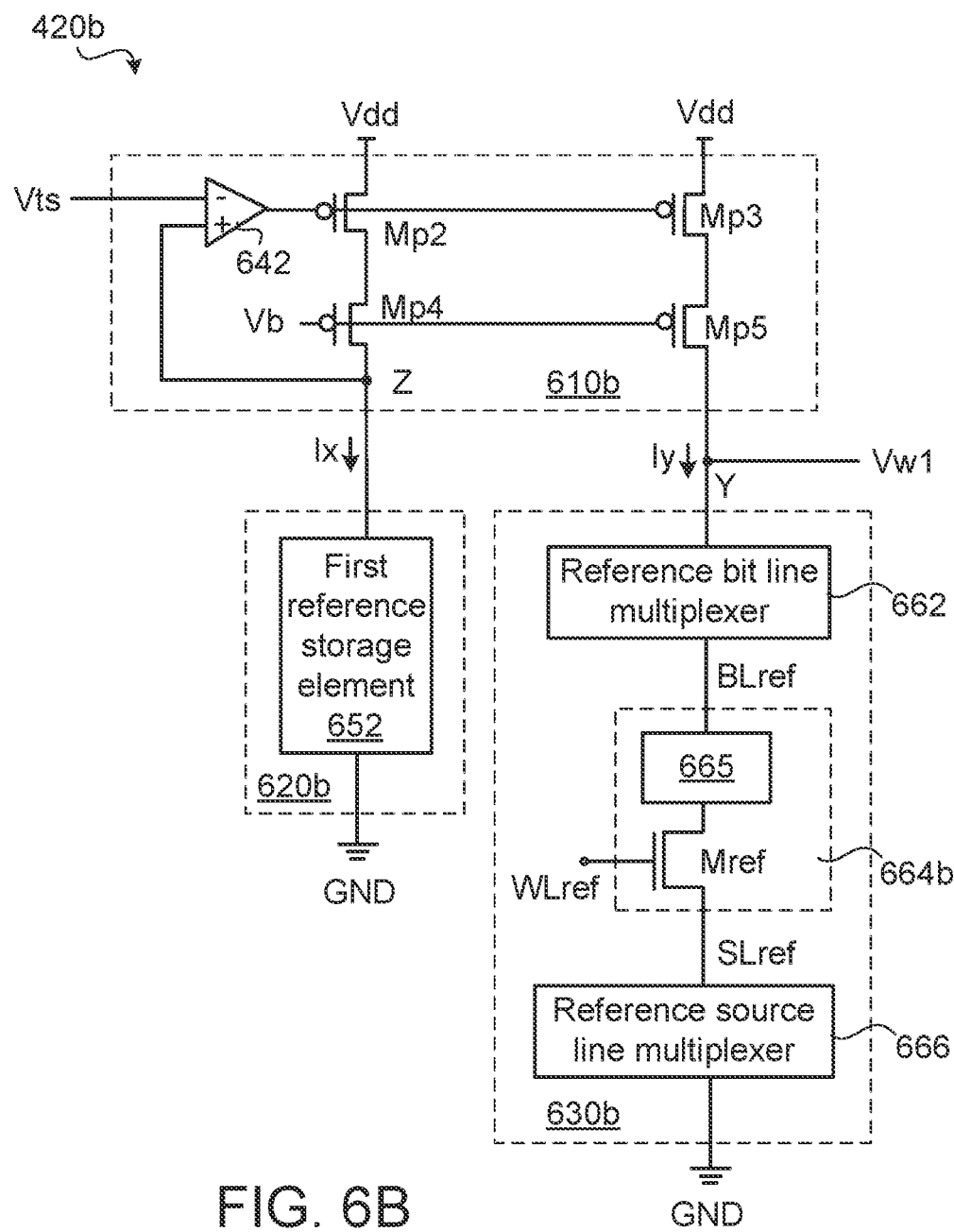
FIG. 6B is a schematic circuit diagram illustrating a second exemplary process corner compensation circuit of the write voltage generator according to the embodiment of the present invention.

FIG. 6B is a schematic circuit diagram illustrating a second exemplary process corner compensation circuit of the write voltage generator capable of providing a first write voltage according to the embodiment of the present invention. The process corner compensation circuit 420b comprises a current mirror 610b, a storage element equivalent circuit 620b and a write path equivalent circuit 630b.

The current mirror 610b receives the transition voltage Vts from the temperature compensation circuit. The current mirror 610b comprises an operational amplifier 642 and plural PMOS transistors Mp2, Mp3, Mp4 and Mp5. The aspect ratios (W/L) of the PMOS transistors Mp2, Mp3, Mp4 and Mp5 are equal.

The negative input terminal of the operational amplifier 642 receives the transition voltage Vts. The positive input terminal of the operational amplifier 642 is connected with a node Z. The node Z is the first terminal of the current mirror 610b.

The first drain/source terminals of the PMOS transistors Mp2 and Mp3 receive the supply voltage Vdd. The gate terminals of the PMOS transistors Mp2 and Mp3 are connected with the output terminal of the operational amplifier 642. The gate terminals of the PMOS transistors Mp4 and Mp5 receive a bias voltage Vb. The first drain/source terminal of the PMOS transistor Mp4 is connected with the second drain/source terminal of the PMOS transistor Mp2. The second drain/source terminal of the PMOS transistor Mp4 is connected with the node Z. The first drain/source terminal of the PMOS transistor Mp5 is connected with the second drain/source terminal of the PMOS transistor Mp3. The second drain/source terminal of the PMOS transistor Mp5 is connected with the node Y. The node Y is the second terminal of the current mirror 610b. In addition, the first write voltage Vw1 is outputted from the node Y.

The storage element equivalent circuit 620b comprises a first reference storage element 652. The circuitry structure of the first reference storage element 652 is identical to that of the storage element 120 as shown in FIG. 1, and not redundantly described herein. The current mirror 610b provides the transition voltage Vts to the first terminal. Consequently, the first reference storage element 652 generates an input current Ix in response to the transition voltage Vts. Then, a mirror current Iy is generated from the second terminal of the current mirror 610b in response to the input current Ix.

The write path equivalent circuit 630b comprises a reference bit line multiplexer 662, a reference bit line BLref, a reference memory cell 664b, a reference source line SLref and a reference source line multiplexer 666. The reference memory cell 664b comprises a second reference storage element 665, a reference select transistor Mref and a reference word line WLref. The reference word line WLref receives an on voltage (Von). The circuitry structure of the write path equivalent circuit 630b is identical to that the write path as shown in FIG. 3B, and not redundantly described herein.

According to the input current Ix, a mirror current Iy is generated from the second terminal of the current mirror 610b, and the mirror current Iy flows to the write path equivalent circuit 630b. The mirror current Iy flows through the write path equivalent circuit 630b to generate the first write voltage Vw1. Moreover, the write voltage Vw1 is outputted from the node Y. The input current Ix is equal to the mirror current Iy.

In an embodiment, the MRAM and the write voltage generator are manufactured simultaneously. Consequently, all transistors in the MRAM and the write voltage generator have the same process corner.

In other words, the write path equivalent circuit 630b of the process corner compensation circuit 420b and the write path of the memory cell array may have the same resistance value. Consequently, in response to the first write voltage Vw1 from the write voltage generator 400, the storage state of the selected memory cell in the write path of the memory cell array can be changed to the first storage stage successfully. That is, the storage state of the storage element in the selected memory cell can be changed in response to the transition voltage Vts.

For example, in case that the first reference storage element 652 and the second reference storage element 665 are both in the second storage state, the process corner compensation circuit 420b is capable of providing the first write voltage Vw1. Because the first reference storage element 652, the second reference storage element 665 and a selected storage element in the selected memory cell have almost identical resistance value, the selected memory cell of the memory cell array can successfully be changed from the second storage state to the first storage state.

Figure 6C:
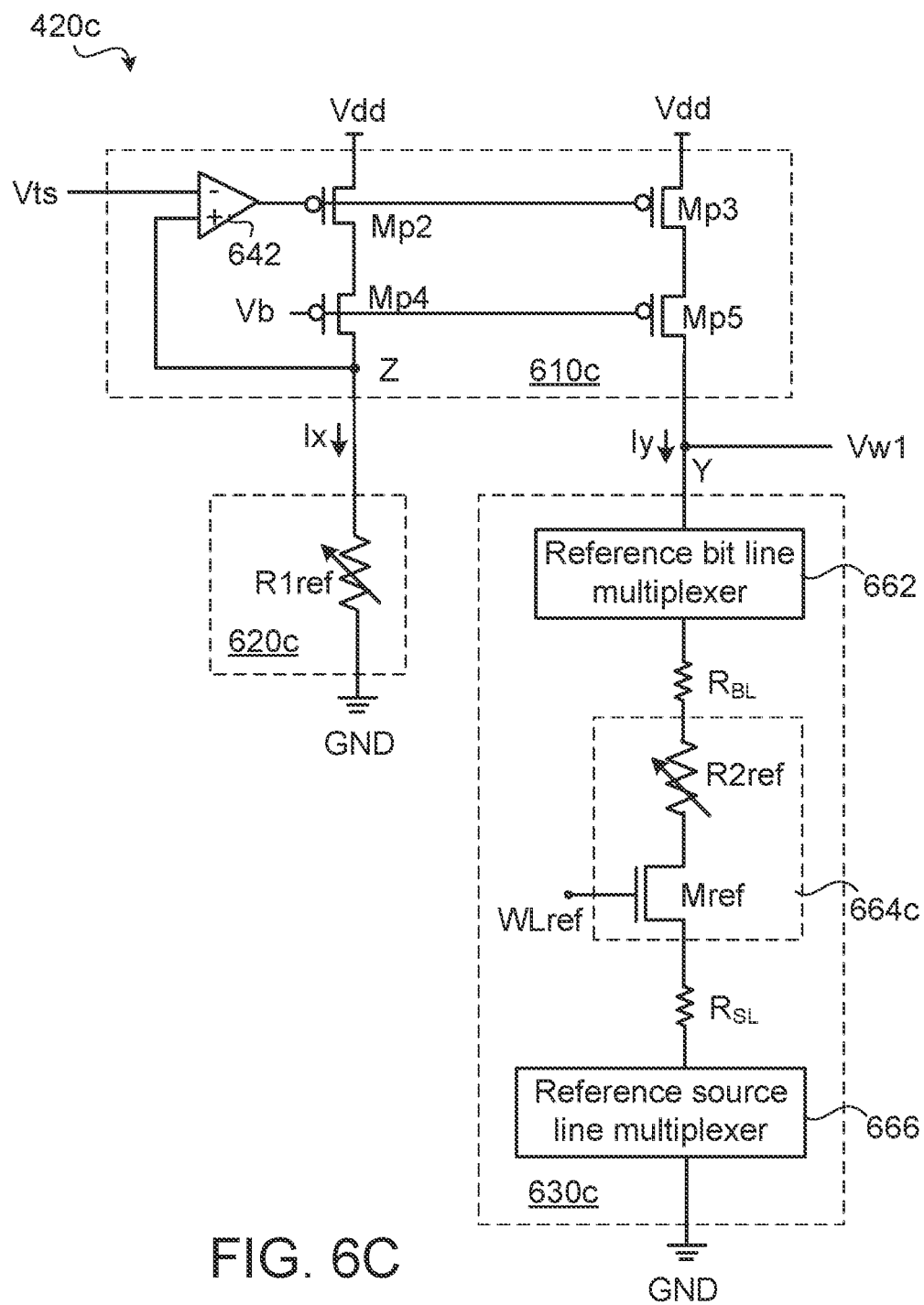
FIG. 6C is a schematic circuit diagram illustrating a third exemplary process corner compensation circuit of the write voltage generator according to the embodiment of the present invention.

FIG. 6C is a schematic circuit diagram illustrating a third exemplary process corner compensation circuit of the write voltage generator capable of providing a first write voltage according to the embodiment of the present invention. The process corner compensation circuit 420c comprises a current mirror 610c, a storage element equivalent circuit 620c and a write path equivalent circuit 630c. The circuitry structure of the current mirror 610c is identical to that of FIG. 6B, and not redundantly described herein.

The storage element equivalent circuit 620c comprises a first reference resistor R1ref. The first reference resistor R1ref is a variable resistor. The resistance value of the first reference resistor R1ref can be adjusted to the resistance value of the second storage state (e.g., 4K ohms). Similarly, the current mirror 610c provides the transition voltage Vts to the first terminal. Consequently, the first reference resistor R1ref generates an input current Ix in response to the transition voltage Vts. Then, a mirror current Iy is generated from the second terminal of the current mirror 610b in response to the input current Ix.

The write path equivalent circuit 630c comprises a reference bit line multiplexer 662, a bit line equivalent resistance $R_{BL}$, a reference memory cell 664c, a source line equivalent resistance $R_{SL}$ and a reference source line multiplexer 666. Moreover, the reference memory cell 664c comprises a second reference resistor R2ref, a reference select transistor Mref and a reference word line WLref. The reference word line WLref receives the on voltage (Von).

In comparison with the write path equivalent circuit 630b of FIG. 6B, the write path equivalent circuit 630c in FIG. 6C uses the bit line equivalent resistance $R_{BL}$ and the source line equivalent resistance $R_{SL}$ to replace the reference bit line BLref and the reference source line SLref. In addition, the second reference resistor R2ref is used to replace the second reference storage element 665. The second reference resistor R2ref is a variable resistor. The resistance value of the second reference resistor R2ref can be adjusted to the resistance value of the second storage state (e.g., 4K ohms).

Similarly, according to the input current Ix, a mirror current Iy is generated from the second terminal of the current mirror 610c, and the mirror current Iy flows to the write path equivalent circuit 630c. The mirror current Iy flows through the write path equivalent circuit 630c to generate the first write voltage Vw1. Moreover, the write voltage Vw1 is outputted from the node Y. The input current Ix is equal to the mirror current Iy.

For example, in case that the resistance values of the first reference resistor R1ref and the second reference resistor R2ref are 4K ohms corresponding to the second storage state, the process corner compensation circuit 420c is capable of providing the first write voltage Vw1. Because the first reference resistor R1ref, the second reference resistor R2ref and a selected storage element in the selected memory cell have almost identical resistance value, the selected memory cell of the memory cell array can successfully be changed from the second storage state to the first storage state.

Figure 6D:
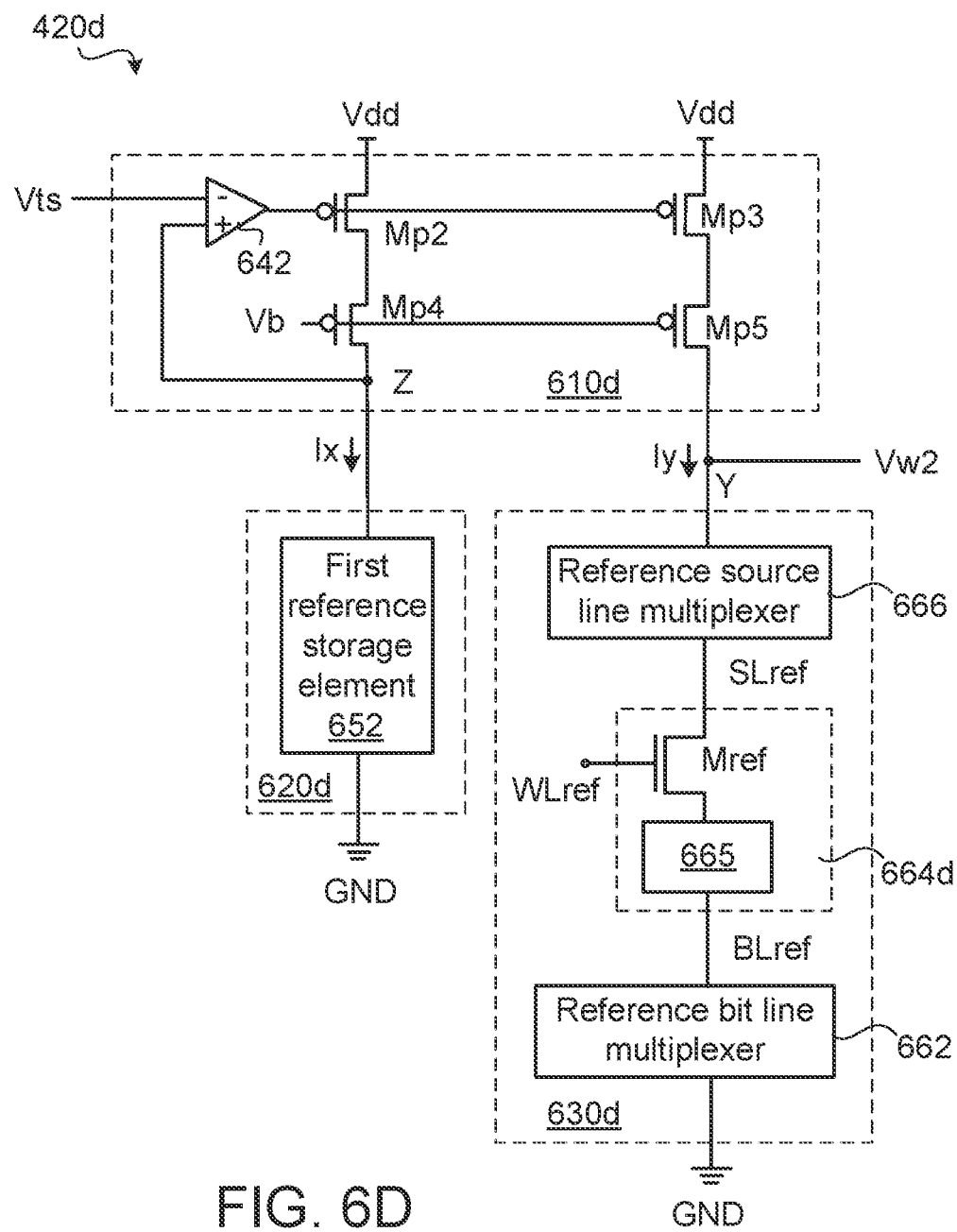
FIG. 6D is a schematic circuit diagram illustrating a fourth exemplary process corner compensation circuit of the write voltage generator according to the embodiment of the present invention.

FIG. 6D is a schematic circuit diagram illustrating a fourth exemplary process corner compensation circuit of the write voltage generator capable of providing a second write voltage according to the embodiment of the present invention. The process corner compensation circuit 420d comprises a current mirror 610d, a storage element equivalent circuit 620d and a write path equivalent circuit 630d. The circuitry structure of the current mirror 610d is identical to that of FIG. 6B, and not redundantly described herein. The circuitry structure of the storage element equivalent circuit 620d is identical to that of FIG. 6B, and not redundantly described herein.

The write path equivalent circuit 630d comprises a reference bit line multiplexer 662, a reference bit line BLref, a reference memory cell 664d, a reference source line SLref and a reference source line multiplexer 666. The reference memory cell 664d comprises a second reference storage element 665, a reference select transistor Mref and a reference word line WLref. The reference word line WLref receives an on voltage (Von).

In the write path equivalent circuit 630d, the reference source line multiplexer 666 is connected between the node Y and the reference source line SLref. The reference bit line multiplexer 662 is connected between the ground terminal GND and the reference bit line BLref. The reference memory cell 664d is connected to the reference bit line BLref, reference source line SLref and the reference word line WLref.

The same, according to the input current Ix, a mirror current Iy is generated from the second terminal of the current mirror 610d, and the mirror current Iy flows to the write path equivalent circuit 630d. The mirror current Iy flows through the write path equivalent circuit 630d to generate the second write voltage Vw2. Moreover, the write voltage Vw2 is outputted from the node Y. The input current Ix is equal to the mirror current Iy.

In an embodiment, the write path equivalent circuit 630d of the process corner compensation circuit 420d and the write path of the memory cell array may have the same circuitry structure. Consequently, in response to the second write voltage Vw2 outputted from the write voltage generator 400, the storage element of the selected memory cell in the write path can receive the transition voltage Vts and the selected memory cell of the memory cell array can be changed to the second storage stage successfully.

In case that the first reference storage element 652 and the second reference storage element 665 are both in the first storage state, the process corner compensation circuit 420d is capable of providing the second write voltage Vw2. Because the first reference storage element 652, the second reference storage element 665 and a selected storage element in the selected memory cell have almost identical resistance value, the selected memory cell of the memory cell array can successfully be changed from the first storage state to the second storage state.

Figure 6E:
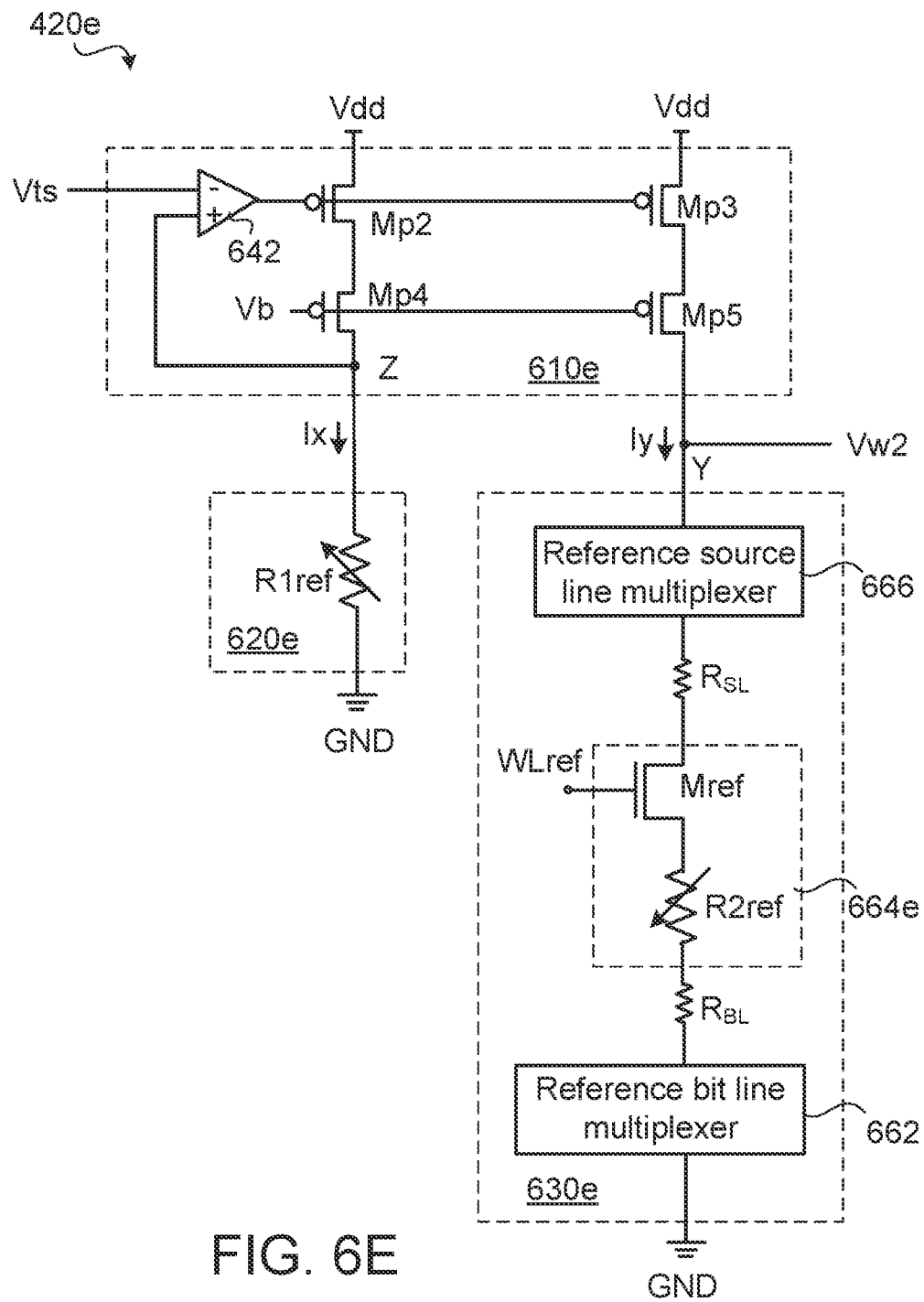
FIG. 6E is a schematic circuit diagram illustrating a fifth exemplary process corner compensation circuit of the write voltage generator according to the embodiment of the present invention.

FIG. 6E is a schematic circuit diagram illustrating a fifth exemplary process corner compensation circuit of the write voltage generator capable of providing a second write voltage according to the embodiment of the present invention. The process corner compensation circuit 420e comprises a current mirror 610e, a storage element equivalent circuit 620e and a write path equivalent circuit 630e. The circuitry structure of the current mirror 610e is identical to that of FIG. 6C, and not redundantly described herein. The circuitry structure of the storage element equivalent circuit 620e is identical to that of FIG. 6C, and not redundantly described herein.

The write path equivalent circuit 630e comprises a reference bit line multiplexer 662, a bit line equivalent resistance $R_{BL}$, a reference memory cell 664e, a source line equivalent resistance $R_{SL}$ and a reference source line multiplexer 666. Moreover, the reference memory cell 664e comprises a second reference resistor R2ref, a reference select transistor Mref and a reference word line WLref. The reference word line WLref receives the on voltage (Von).

In comparison with the write path equivalent circuit 630d of FIG. 6D, the write path equivalent circuit 630e in FIG. 6E uses the bit line equivalent resistance $R_{BL}$ and the source line equivalent resistance $R_{SL}$ to replace the reference bit line BLref and the reference source line SLref. In addition, the second reference resistor R2ref is used to replace the second reference storage element 665. The second reference resistor R2ref is a variable resistor. The resistance value of the second reference resistor R2ref can be adjusted to the resistance value of the first storage state (e.g., 2K ohms).

Similarly, according to the input current Ix, a mirror current Iy is generated from the second terminal of the current mirror 610e, and the mirror current Iy flows to the write path equivalent circuit 630e. The mirror current Iy flows through the write path equivalent circuit 630e to generate the second write voltage Vw2. Moreover, the write voltage Vw2 is outputted from the node Y. The input current Ix is equal to the mirror current Iy.

In case that the resistance values of the first reference resistor R1ref and the second reference resistor R2ref are 2K ohms corresponding to the first storage state, the process corner compensation circuit 420e is capable of providing the second write voltage Vw2. Because the first reference resistor R1ref, the second reference resistor R2ref and a selected storage element in the selected memory cell have almost identical resistance value, the selected memory cell of the memory cell array can successfully be changed from the first storage state to the second storage state.

In some embodiments, each of the process corner compensation circuits 420a-a20e further comprises a voltage regulator. The input terminal of the voltage regulator is connected with the node Y to receive the write voltage Vw. The output terminal of the voltage regulator can generate the same write voltage Vw. The function of the voltage regulator is similar to the buffering circuit to enhance the driving strength of the write voltage generator.

According to the embodiment of the present invention, the MRAM and the write voltage generator are manufactured simultaneously, all transistors in the MRAM and the write voltage generator have the same process corner. In the present invention, the current mirror 610a-610e is used to generate the mirror current Iy to ensure that the second storage element in the write path equivalent circuits 630a to 630e can receive the transition voltage Vts, and the write path equivalent circuits 630a to 630e can generate accurate write voltage. Furthermore, since the write path equivalent circuits 630a-630e are almost identical to the write path in the MRAM. Thus, when the MRAM receives the write voltage Vw from the write voltage generator 400, the storage element of selected memory cell in the write path can receive the accurate transition voltage Vts and successfully change the storage state.

It is noted that numerous modifications and alterations may be made while retaining the teachings of the invention. For example, in another embodiment, two write voltage generators are used for providing two write voltages to the MRAM. The first write voltage generator generates the first write voltage. The second write voltage generator generates the second write voltage.

In the above embodiments, the write voltage generator is applied to the memory cell array of MRAM. It is noted that the technology of the present invention can be applied to other non-volatile memory. For example, the write voltage generator can be applied to the memory cell array of the resistive random-access memory (RRAM or ReRAM).

From the above descriptions, the present invention provides a write voltage generator for a MRAM. The write voltage generator comprises a temperature compensation circuit and a process corner compensation circuit. The temperature compensation circuit generates a transition voltage according to the ambient temperature change. The process corner compensation circuit generates a write voltage to a write path according to the process corner of the memory cell array. Consequently, during the write operation, the storage state of the selected memory cell in the write path of the memory cell array can be surely changed.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A write voltage generator coupled to a memory cell array, the write voltage generator providing a write voltage during a write operation, a storage state of a selected memory cell in a write path of the memory cell array being changed in response to the write voltage, the write voltage generator comprising:
   a temperature compensation circuit generating a transition voltage according to an ambient temperature, wherein the transition voltage decreases with the increasing ambient temperature; and
   a process corner compensation circuit comprising a current mirror, a storage element equivalent circuit and a write path equivalent circuit, wherein the current mirror receives the transition voltage, the storage element equivalent circuit is connected between a first terminal of the current mirror and a ground terminal, a second terminal of the current mirror is connected with a first node, the write path equivalent circuit is connected between the first node and the ground terminal, and the write voltage is outputted from the first node.

2. The write voltage generator as claimed in claim 1, wherein the temperature compensation circuit comprises a complementary to absolute temperature circuit.

3. The write voltage generator as claimed in claim 2, wherein the complementary to absolute temperature circuit comprises:
   a first voltage generator generating a first voltage with a negative temperature coefficient; and
   a second voltage generator generating a second voltage with a positive temperature coefficient,
   wherein the transition voltage is equal to a product of the first voltage and a first constant plus a product of the second voltage and a second constant.

4. The write voltage generator as claimed in claim 3, wherein the first voltage generator is a base-emitter voltage generator, the first voltage is base-emitter voltage of a bipolar junction transistor, the second voltage generator is a thermal voltage generator, and the second voltage is a thermal voltage.

5. The write voltage generator as claimed in claim 2, wherein the temperature compensation circuit further comprises:
   a buffering circuit, wherein an input terminal of the buffering circuit is connected with the complementary to absolute temperature circuit, and an output terminal of the buffering circuit is connected with a second node; and
   an upper voltage limiting circuit, wherein an input terminal of the upper voltage limiting circuit receives an upper limit voltage, and an output terminal of the upper voltage limiting circuit is connected with the second node;
   wherein the transition voltage is outputted from the second node, and the transition voltage is limited by the upper limit voltage.

6. The write voltage generator as claimed in claim 2, wherein the temperature compensation circuit further comprises:
   a buffering circuit, wherein an input terminal of the buffering circuit is connected with the complementary to absolute temperature circuit, and an output terminal of the buffering circuit is connected with a second node; and
   a lower voltage limiting circuit, wherein an input terminal of the lower voltage limiting circuit receives a lower limit voltage, and an output terminal of the lower voltage limiting circuit is connected with the second node;

wherein the transition voltage is outputted from the second node, and the transition voltage is limited by the lower limit voltage.

7. The write voltage generator as claimed in claim 2, wherein the temperature compensation circuit further comprises:
a buffering circuit comprising a first operational amplifier, wherein a positive input terminal of the first operational amplifier is connected with the complementary to absolute temperature circuit, a negative input terminal of the first operational amplifier is connected with a second node, an output terminal of the first operational amplifier is connected with the second node;
a lower voltage limiting circuit comprising a first PMOS transistor and a second operational amplifier, wherein a negative input terminal of the second operational amplifier receives a lower limit voltage, a positive input terminal of the second operational amplifier is connected with the second node, an output terminal of the second operational amplifier is connected with a gate terminal of the first PMOS transistor, a first drain/source terminal of the first PMOS transistor receives a supply voltage, and a second drain/source terminal of the first PMOS transistor is connected with the second node; and
an upper voltage limiting circuit comprising a first NMOS transistor and a third operational amplifier, wherein a negative input terminal of the third operational amplifier receives an upper limit voltage, a positive input terminal of the third operational amplifier is connected with the second node, an output terminal of the third operational amplifier is connected with a gate terminal of the first NMOS transistor, a first drain/source terminal of the first NMOS transistor is connected with the ground terminal, and a second drain/source terminal of the first NMOS transistor is connected with the second node,
wherein the transition voltage is outputted from the second node, and the transition voltage is limited between the upper limit voltage and the lower limit voltage.

8. The write voltage generator as claimed in claim 1, wherein the current mirror comprises:
a first operational amplifier, wherein a negative input terminal of the first operational amplifier receives the transition voltage, a positive input terminal of the first operational amplifier is connected with a second node, and the second node is the first terminal;
a first PMOS transistor, wherein a first drain/source terminal of the first PMOS transistor receives a supply voltage, and a gate terminal of the first PMOS transistor is connected with an output terminal of the first operational amplifier;
a second PMOS transistor, wherein a first drain/source terminal of the second PMOS transistor receives the supply voltage, and a gate terminal of the second PMOS transistor is connected with the output terminal of the first operational amplifier;
a third PMOS transistor, wherein a first drain/source terminal of the third PMOS transistor is connected with a second drain/source terminal of the first PMOS transistor, a gate terminal of the third PMOS transistor receives a bias voltage, and a second drain/source terminal of the third PMOS transistor is connected with the second node; and
a fourth PMOS transistor, wherein a first drain/source terminal of the fourth PMOS transistor is connected with a second drain/source terminal of the second PMOS transistor, a gate terminal of the fourth PMOS transistor receives the bias voltage, and a second drain/source terminal of the fourth PMOS transistor is connected with the first node.

9. The write voltage generator as claimed in claim 1, wherein the storage element equivalent circuit comprises a first reference storage element, and the first reference storage element is connected between the first terminal and the ground terminal.

10. The write voltage generator as claimed in claim 9, wherein the write path equivalent circuit comprises a reference bit line multiplexer, a reference bit line, a reference memory cell, a reference source line and a reference source line multiplexer, which are serially connected between the second terminal and the ground terminal.

11. The write voltage generator as claimed in claim 10, wherein the reference memory cell comprises a second reference storage element and a reference select transistor, which are serially connected with each other, wherein the first reference storage element and the second reference storage element has a same storage state.

12. The write voltage generator as claimed in claim 11, wherein a first resistance value of the first reference storage element is substantially equal to a second resistance value of the second reference storage element, and the second resistance value of the second reference storage element is substantially equal to a third resistance value of a selected storage element in the selected memory cell.

13. The write voltage generator as claimed in claim 1, wherein storage element equivalent circuit comprises a first reference resistor, and the first reference resistor is a variable resistor.

14. The write voltage generator as claimed in claim 13, wherein the write path equivalent circuit comprises a reference bit line multiplexer, a bit line equivalent resistance, a reference memory cell, a source line equivalent resistance and a reference source line multiplexer, which are serially connected between the second terminal and the ground terminal.

15. The write voltage generator as claimed in claim 14, wherein the reference memory cell comprises a second reference resistor and a reference select transistor, wherein the second reference resistor is a variable resistor.

16. The write voltage generator as claimed in claim 15, wherein a first resistance value of the first reference resistor is substantially equal to a second resistance value of the second reference resistor, and the second resistance value of the second reference resistor is substantially equal to a third resistance value of a selected storage element in the selected memory cell.

17. The write voltage generator as claimed in claim 1, wherein the first node is further connected with an input terminal of a voltage regulator, and an output terminal of the voltage regulator outputs the write voltage.

18. The write voltage generator as claimed in claim 1, wherein the memory cell array is the memory cell array of a magnetoresistive random access memory or the memory cell array of a resistive random-access memory.

* * * * *